(12) United States Patent
Kusuda

(10) Patent No.: US 9,295,107 B2
(45) Date of Patent: *Mar. 22, 2016

(54) HEAT TREATMENT APPARATUS HEATING SUBSTRATE BY IRRADIATION WITH LIGHT

(71) Applicant: SCREEN HOLDINGS CO., LTD., Kyoto (JP)

(72) Inventor: Tatsufumi Kusuda, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 50 days.

This patent is subject to a terminal disclaimer.

(21) Appl. No.: 14/228,380

(22) Filed: Mar. 28, 2014

(65) Prior Publication Data

US 2014/0212117 A1    Jul. 31, 2014

Related U.S. Application Data

(60) Continuation of application No. 13/848,526, filed on Mar. 21, 2013, now Pat. No. 8,781,309, which is a division of application No. 13/236,900, filed on Sep. 20, 2011, now Pat. No. 8,447,177, which is a continuation of application No. 12/183,159, filed on Jul. 31, 2008, now Pat. No. 8,050,546.

(30) Foreign Application Priority Data

Sep. 12, 2007   (JP) .................................. 2007-236249

(51) Int. Cl.
*F26B 19/00*   (2006.01)
*A45D 20/40*   (2006.01)
(Continued)

(52) U.S. Cl.
CPC .............. *H05B 1/0227* (2013.01); *H01L 21/26* (2013.01); *H01L 21/67115* (2013.01); *H01L 21/68742* (2013.01); *H01L 21/68785* (2013.01); *H01L 2924/0002* (2013.01)

(58) Field of Classification Search
None
See application file for complete search history.

(56) References Cited

U.S. PATENT DOCUMENTS 6,113,733 A * 9/2000 Eriguchi et al. ......... 156/345.24
6,859,616 B2 * 2/2005 Kusuda et al. ................ 392/416
(Continued)

FOREIGN PATENT DOCUMENTS

JP    01-223789    9/1989
JP    03-156433    7/1991
(Continued)

OTHER PUBLICATIONS

Office Action issued by the Japanese Patent Office on Dec. 11, 2012 in connection with corresponding Japanese Patent Application No. 2010-001899 & English translation.
(Continued)

*Primary Examiner* — Thor Campbell
(74) *Attorney, Agent, or Firm* — Ostrolenk Faber LLP

(57) ABSTRACT

A capacitor, a coil, a flash lamp, and a switching element such as an IGBT are connected in series. A controller outputs a pulse signal to the gate of the switching element. A waveform setter sets the waveform of the pulse signal, based on the contents of input from an input unit. With electrical charge accumulated in the capacitor, a pulse signal is output to the gate of the switching element so that the flash lamp emits light intermittently. A change in the waveform of the pulse signal applied to the switching element will change the waveform of current flowing through the flash lamp and, accordingly, the form of light emission, thereby resulting in a change in the temperature profile for a semiconductor wafer.

2 Claims, 9 Drawing Sheets

(51) Int. Cl.
  *H05B 1/02* (2006.01)
  *H01L 21/67* (2006.01)
  *H01L 21/687* (2006.01)
  *H01L 21/26* (2006.01)

(56) References Cited

U.S. PATENT DOCUMENTS

| | | | |
|---|---|---|---|
| 6,936,797 B2* | 8/2005 | Hosokawa | 219/405 |
| 7,501,607 B2* | 3/2009 | Camm et al. | 219/679 |
| 8,050,546 B2* | 11/2011 | Kusuda | 392/418 |
| 8,229,290 B2* | 7/2012 | Kusuda | 392/418 |
| 2003/0013280 A1 | 1/2003 | Yamanaka | |
| 2005/0062388 A1* | 3/2005 | Camm et al. | 313/231.71 |
| 2005/0236395 A1* | 10/2005 | Timans et al. | 219/497 |
| 2007/0069161 A1* | 3/2007 | Camm et al. | 250/504 R |
| 2007/0087492 A1 | 4/2007 | Yamanaka | |
| 2008/0190909 A1* | 8/2008 | Yokouchi | 219/385 |

FOREIGN PATENT DOCUMENTS

| | | |
|---|---|---|
| JP | 05-152653 | 6/1993 |
| JP | 07-078695 | 3/1995 |
| JP | 07-022497 | 4/1995 |
| JP | 07-065975 | 10/1995 |
| JP | 2002-252174 | 9/2002 |
| JP | 2005-197024 | 7/2005 |
| JP | 2007-192749 | 8/2007 |
| JP | 2009-508337 | 2/2009 |
| WO | WO2007/030941 | 3/2007 |

OTHER PUBLICATIONS

Translation of Office Action issued by the Japanese Patent Office on Dec. 11, 2012 in connection with corresponding Japanese Patent Application No. 2010-001899.

Office Action issued by the Japanese Patent Office on Aug. 6, 2013 in connection with corresponding Japanese Patent Application No. 2007-236249.

Translation of Office Action issued by the Japanese Patent Office on Aug. 6, 2013 in connection with corresponding Japanese Patent Application No. 2007-236249.

* cited by examiner

F I G. 1
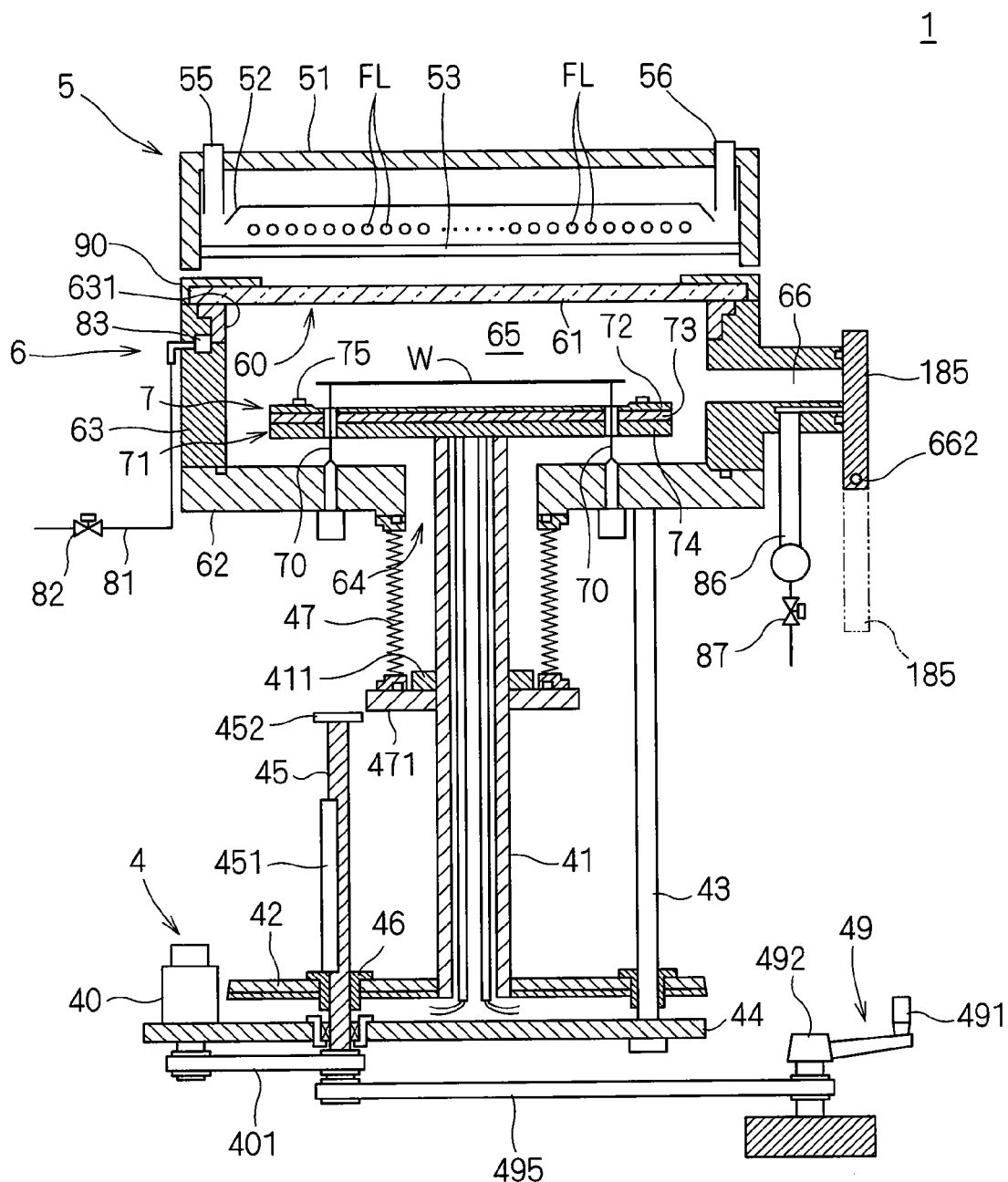

F I G. 2
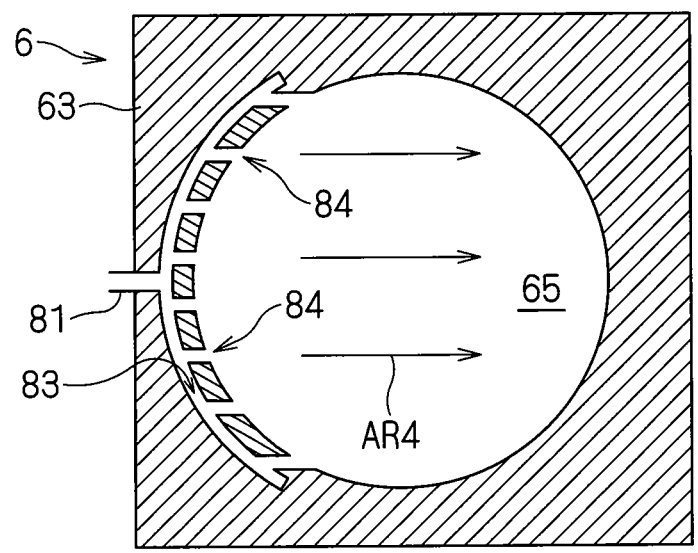

F I G . 3
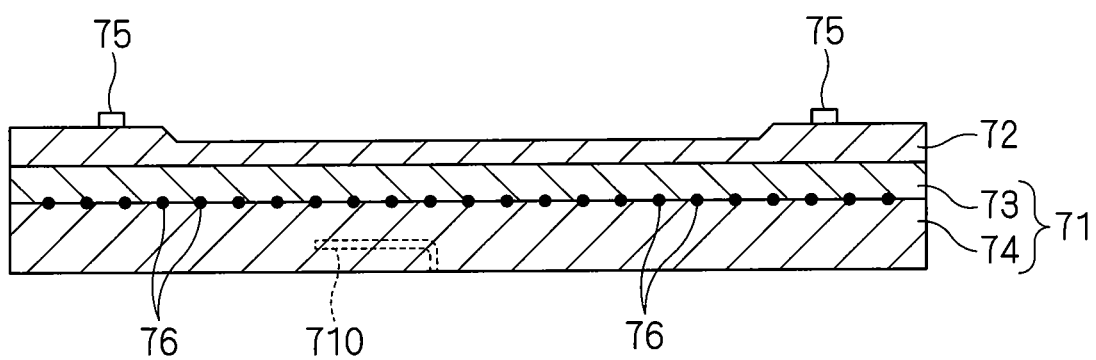

HEAT TREATMENT APPARATUS HEATING SUBSTRATE BY IRRADIATION WITH LIGHT

CROSS REFERENCE TO RELATED APPLICATION

This application is a continuation of U.S. application Ser. No. 13/848,526, filed Mar. 21, 2013 by Tatsufumi KUSADA entitled HEAT TREATMENT APPARATUS HEATING SUBSTRATE BY IRRADIATION WITH LIGHT, which is a divisional of U.S. application Ser. No. 13/236,900, filed Sep. 20, 2011 by Tatsufumi KUSADA entitled HEAT TREATMENT APPARATUS HEATING SUBSTRATE BY IRRADIATION WITH LIGHT, which is a continuation of U.S. application Ser. No. 12/183,159, filed Jul. 31, 2008, by Tatsufumi KUSADA entitled HEAT TREATMENT APPARATUS HEATING SUBSTRATE BY IRRADIATION WITH LIGHT which claims the benefit of Japanese Appln. S.N. JP2007-236249 filed Sep. 12, 2007, the contents of which are incorporated by this reference.

BACKGROUND OF THE INVENTION

1. Field of the Invention

The present invention relates to a heat treatment apparatus that irradiates a substrate such as a semiconductor wafer and a glass substrate for a liquid crystal display with light, to thereby heat the substrate.

2. Description of the Background Art

Short-time annealing has conventionally been achieved using rapid lamp annealers that use the energy of light emitted from halogen lamps to raise the temperature of a semiconductor wafer at rates of about several hundred degrees per second, as disclosed in U.S. Pat. No. 6,518,547. The rapid lamp annealers have shorter annealing time than heat treatment apparatuses that employ a resistance heating method using a kanthal heater or the like, but their annealing time is only on the order of several seconds.

On the other hand, flash lamp annealers that employ xenon flash lamps to irradiate a semiconductor wafer surface with a flash of light, as disclosed in U.S. Pat. No. 6,998,580, are known to achieve shorter annealing time. The length of time that the xenon flash lamps emit a flash of light is extremely short, about 10 milliseconds or less. The xenon flash lamps also have a spectral distribution of radiation that ranges from ultraviolet to near-infrared regions with shorter wavelengths than given with conventional halogen lamps, and that is in close agreement with a fundamental absorption band of a silicon semiconductor wafer. From this, the emission of a flash of light from the xenon flash lamps to a semiconductor wafer will produce only a small amount of transmitted light, thereby allowing a rapid rise in the temperature of the semiconductor wafer. It has also been found that an extremely-short-time (about 10 milliseconds or less) flash-light irradiation allows a selective rise in temperature only near the semiconductor wafer surface. For this reason, the flash lamp annealers are suitable for activating ions in an ion-implanted semiconductor wafer and allow the formation of shallow junctions by ion activation with no thermal diffusion of ions.

Laser annealers achieve still shorter annealing time than the flash lamp annealers. The laser annealers provide annealing by scanning a pulse laser beam with a duration of several dozen nanoseconds, in both X and Y directions.

There is, however, no conventional technique that provides annealing time within an intermediate range between the range achieved by the rapid lamp annealers using halogen lamps and the range achieved by the flash lamp annealers. In other words, there is no heat treatment apparatus that permits annealing time on the order of 10 milliseconds to 1 second at each place on the major surface of a semiconductor wafer. Nowadays, heat treatment providing such an intermediate rage of annealing time is being required in various process steps, such as activation, metallization, and wiring, in the manufacture of transistors.

The use of halogen lamps to achieve the above-described intermediate range of annealing time requires an increase in filament thickness due to the necessity of greater output and therefore has the drawback of increasing heat capacity and thereby rather slowing down the rates of temperature rise and fall.

The laser annealers, on the other hand, will theoretically achieve the above-described intermediate range of annealing time by increasing the length of time that a pulse laser beam remains at each place on a semiconductor wafer. But, keeping a pulse laser beam for a longer time at a particular place causes a temperature rise even in an unexposed region, so that the phenomenon of switching occurring in overlaps between temperature-raised regions becomes more pronounced. An even greater drawback is impractically low throughput because about one hour is necessary to process a single semiconductor wafer as a result of an increase in the length of time that a pulse laser beam remains at each place.

In addition, there are not only the simple need for rapid temperature rise and fall, but also the need to freely change the temperature profile at the time of annealing.

SUMMARY OF THE INVENTION

The invention is intended to provide a heat treatment apparatus that irradiates a substrate with light to thereby heat the substrate.

According to an aspect of the invention, the heat treatment apparatus includes a holder holding a substrate; a flash lamp emitting light to the substrate held by the holder; a switching element connected in series to the flash lamp, a capacitor, and a coil; and a pulse-signal generator generating and outputting a pulse signal including one or more pulses to the switching element to thereby control drive of the switching element.

Providing chopper control over the light emission from the flash lamp, the heat treatment apparatus allows free setting of annealing time and the temperature profile at the time of annealing by only setting the waveform of the pulse signal.

Preferably, the switching element is an insulated-gate bipolar transistor, and the pulse-signal generator outputs a pulse signal to the gate of the insulated-gate bipolar transistor.

The use of the insulated-gate bipolar transistor as the switching element is appropriate for the light emission from the flash lamp that requires a large amount of power.

According to another aspect of the invention, the heat treatment apparatus includes a holder holding a substrate; a flash lamp emitting light to the substrate held by the holder; and a chopper controller providing chopper control over light emission from the flash lamp so that light-emission time ranges from one millisecond to less than one second.

Providing chopper control over the light emission from the flash lamp, the heat treatment apparatus allows free setting of annealing time and the temperature profile at the time of annealing.

An object of the invention is thus to provide a heat treatment apparatus that allows free setting of annealing time and the temperature profile at the time of annealing.

These and other objects, features, aspects and advantages of the invention will become more apparent from the following detailed description of the invention when taken in conjunction with the accompanying drawings.

BRIEF DESCRIPTION OF THE DRAWINGS

FIG. 1 is a side sectional view showing a configuration of a heat treatment apparatus according to the invention;

FIG. 2 is a sectional view showing the path of a gas in the heat treatment apparatus in FIG. 1;

FIG. 3 is a sectional view showing the structure of a holder;

DESCRIPTION OF THE PREFERRED EMBODIMENTS

Figure 4:
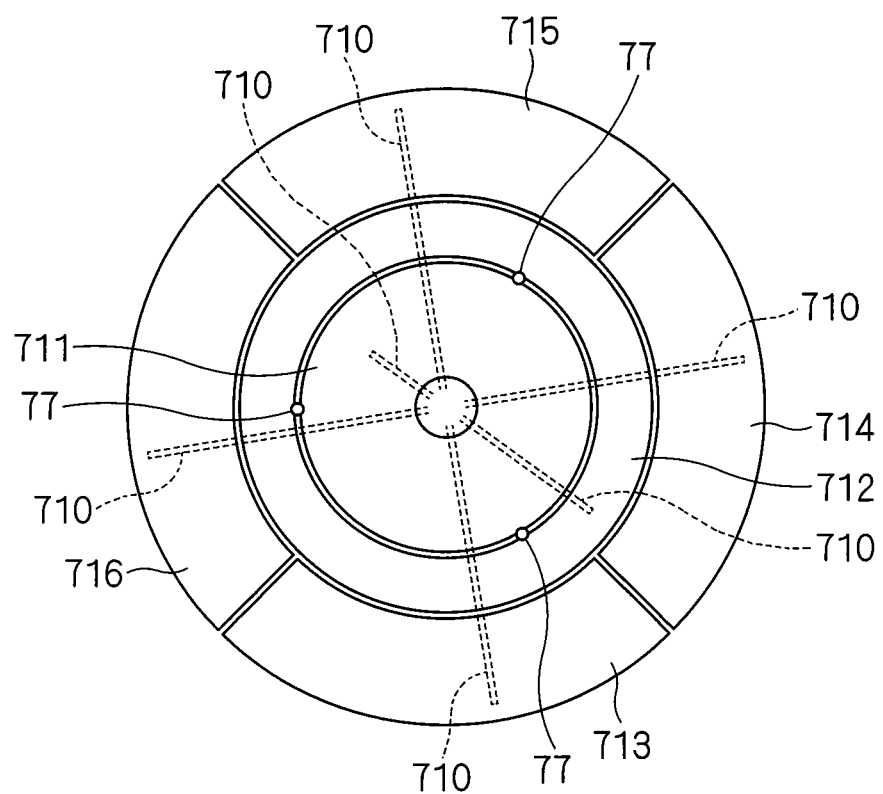
FIG. 4 is a plan view of a hot plate.

Now, preferred embodiments of the invention are described in detail with reference to the drawings.

First, a general configuration of a heat treatment apparatus according to the invention is outlined. FIG. 1 is a side sectional view showing the configuration of a heat treatment apparatus 1 according to the invention. The heat treatment apparatus 1 is a lamp annealer that irradiates a generally-circular semiconductor wafer W as a substrate with light to thereby heat the semiconductor wafer W.

The heat treatment apparatus 1 includes a generally-cylindrical chamber 6 receiving a semiconductor wafer W therein, and a lamp house 5 including a plurality of built-in flash lamps FL. The heat treatment apparatus 1 further includes a controller 3 controlling and causing operating mechanisms in the chamber 6 and in the lamp house 5 to perform heat treatment on the semiconductor wafer W.

The chamber 6 below the lamp house 5 includes a chamber side portion 63 having a generally-cylindrical inner wall; and a chamber bottom portion 62 covering the bottom of the chamber side portion 63. A space surrounded by the chamber side portion 63 and the chamber bottom portion 62 is defined as a heat treatment space 65. Above the heat treatment space 65 is a top opening 60 that is equipped with a chamber window 61 to produce a blockage.

The chamber window 61 forming a ceiling of the chamber 6 is a disk-shaped member made of quartz and serves as a quartz window that transmits light emitted from the lamp house 5 into the heat treatment space 65. The chamber bottom portion 62 and the chamber side portion 63, which are the main body of the chamber 6, are made of, for example, a metal material of high strength and high heat resistance, such as stainless steel. A ring 631 in the upper inner side of the chamber side portion 63 is made of a material such as an aluminum (Al) alloy that has greater durability than stainless steel against degradation due to light emission.

The chamber bottom portion 62 has a plurality of (three, in this preferred embodiment) support pins 70 that extend upright through a holder 7 to support the semiconductor wafer W from the underside (the surface opposite to that exposed to light from the lamp house 5) of the semiconductor wafer W. The support pins 70 are made of, for example, quartz and are easy to replace because they are secured from the outside of the chamber 6.

The chamber side portion 63 has a transport opening 66 for transport of the semiconductor wafer W into and out of the chamber 6. The transport opening 66 will be opened and closed by a gate valve 185 that turns on an axis 662. On one side of the chamber side portion 63 opposite the transport opening 66, an introduction path 81 is formed to introduce a processing gas (e.g., an inert gas such as a nitrogen ($N_2$) gas, a helium (He) gas, or an argon (Ar) gas; or an oxygen ($O_2$) gas; or the like) into the heat treatment space 65. The introduction path 81 has one end connected through a valve 82 to a gas supply mechanism not shown, and the other end connected to a gas introduction buffer 83 formed inside the chamber side portion 63. The transport opening 66 has formed therewith an exhaust path 86 from which a gas in the heat treatment space 65 is exhausted, and it is connected through a valve 87 to an exhaust mechanism not shown.

FIG. 2 is a sectional view of the chamber 6 taken along a horizontal plane at the level of the gas introduction buffer 83. As shown in FIG. 2, the gas introduction buffer 83 is formed to extend over about one third of the inner periphery of the chamber side portion 63 on the side opposite the transport opening 66 in FIG. 1, so that a processing gas introduced through the introduction path 81 to the gas introduction buffer 83 is supplied through a plurality of gas supply holes 84 into the heat treatment space 65.

The heat treatment apparatus 1 further includes the holder 7 of a generally disk shape that holds a semiconductor wafer W in a horizontal position inside the chamber 6 and preheats the holding semiconductor wafer W prior to light irradiation; and a holder elevating mechanism 4 that moves the holder 7 up and down relative to the chamber bottom portion 62 which is the bottom surface of the chamber 6. The holder elevating mechanism 4 in FIG. 1 includes a generally-cylindrical shaft 41, a movable plate 42, guide members 43 (in this preferred embodiment, three guide members 43 around the shaft 41), a fixed plate 44, a ball screw 45, a nut 46, and a motor 40. The chamber bottom portion 62, which is the bottom of the chamber 6, has a generally-circular bottom opening 64 of a smaller diameter than the holder 7. The shaft 41 of stainless steel is inserted through the bottom opening 64 and connected to the underside of the holder 7 (strictly speaking, a hot plate 71 of the holder 7) to support the holder 7.

The nut 46, which is in threaded engagement with the ball screw 45, is fixed to the movable plate 42. The movable plate 42 is slidably guided by the guide members 43 that are fixed to and extend downwardly from the chamber bottom portion 62, so as to be vertically movable. The movable plate 42 is coupled to the holder 7 through the shaft 41.

Figure 5:
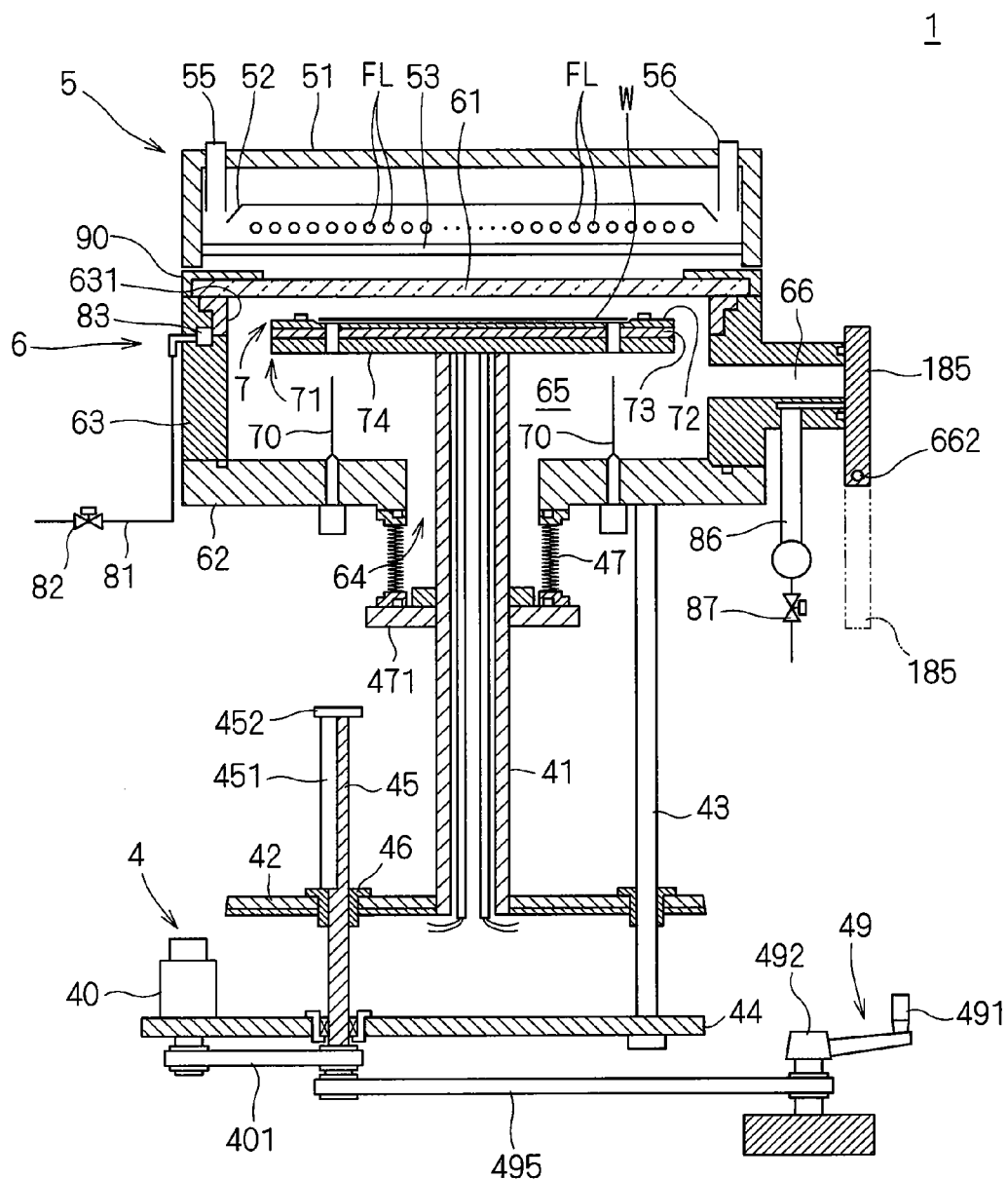
FIG. 5 is a side sectional view showing the configuration of the heat treatment apparatus in FIG. 1.

The motor 40 is installed on the fixed plate 44 mounted to the lower ends of the guide members 43 and is connected to the ball screw 45 through a timing belt 401. When the holder elevating mechanism 4 moves the holder 7 up and down, the motor 40 as a driver rotates the ball screw 45 under the control of the controller 3 so that the movable plate 42 fixed to the nut 46 moves vertically along the guide members 43. The result is that the shaft 41 fixed to the movable plate 42 moves vertically and that the holder 7 connected to the shaft 41 smoothly moves up and down between a transfer position of the semiconductor wafer W shown in FIG. 1 and a processing position of the semiconductor wafer W shown in FIG. 5.

On the upper surface of the movable plate 42, a mechanical stopper 451 of a generally-semi-cylindrical shape (the shape obtained by cutting a cylinder in half along its length) is provided upright to extend along the ball screw 45. Even if the movable plate 42 attempted to move up beyond a certain upper limit due to any anomaly, the top end of the mechanical stopper 451 would strike an end plate 452 provided at the end of the ball screw 45, preventing an irregular upward movement of the movable plate 42. This prevents the holder 7 from moving up beyond a certain level below the chamber window 61, thereby avoiding a collision of the holder 7 with the chamber window 61.

The holder elevating mechanism 4 further includes a manual elevator 49 that manually moves the holder 7 up and down for maintenance of the inside of the chamber 6. The manual elevator 49 includes a handle 491 and a rotary shaft 492, and by rotating the rotary shaft 492 with the handle 491, rotates the ball screw 45 connected through a timing belt 495 to the rotary shaft 492 to allow upward and downward movements of the holder 7.

On the underside of the chamber bottom portion 62, expandable and contractible bellows 47 are provided to extend downwardly around the shaft 41, with their upper ends connected to the underside of the chamber bottom portion 62. The bottom ends of the bellows 47 are mounted to a bellows-bottom-end plate 471. The bellows-bottom-end plate 471 is screwed to the shaft 41 with a collar member 411. The bellows 47 contract when the holder elevating mechanism 4 moves the holder 7 upward relative to the chamber bottom portion 62, while they expand when the holder elevating mechanism 4 moves the holder 7 downward. The expansion and contraction of the bellows 47 keeps the heat treatment space 65 air-tight even during upward and downward movements of the holder 7.

FIG. 3 is a sectional view showing a structure of the holder 7. The holder 7 includes the hot plate (heating plate) 71 that provides preheating (what is called assisted heating) of the semiconductor wafer W; and a susceptor 72 that is installed on the upper surface (the surface on the side where the holder 7 holds the semiconductor wafer W) of the hot plate 71. The underside of the holder 7 is, as previously described, connected to the shaft 41 that moves the holder 7 up and down. The susceptor 72 is made of quartz (or may be of aluminum nitride (AlN) or the like) and has, on the upper surface, pins 75 that prevents misalignment of the semiconductor wafer W. The susceptor 72 is installed on the hot plate 71 so that its underside is in face-to-face contact with the upper surface of the hot plate 71. Thus, the susceptor 72 diffuses and transmits heat energy from the hot plate 71 into the semiconductor wafer W placed on the upper surface, and it is removable from the hot plate 71 to be cleaned for maintenance.

The hot plate 71 includes an upper plate 73 and a lower plate 74, both made of stainless steel. Resistance heating wires 76, such as nichrome wires, for use in heating the hot plate 71 are installed in a space between the upper and lower plates 73 and 74, and the space is filled and sealed with an electrically conductive brazing metal containing nickel (Ni). The upper and lower plates 73 and 74 are brazed or soldered to each other at the ends.

FIG. 4 is a plan view of the hot plate 71. As shown in FIG. 4, the hot plate 71 has a disk-shaped zone 711 and a ring-shaped zone 712 that are concentrically arranged in the middle section of the area facing the semiconductor wafer W being held; and four zones 713 to 716 that are obtained by equally and circumferentially dividing a generally-ring-shaped area surrounding the zone 712, with there being a slight gap between every two zones. The hot plate 71 further has three through holes 77 that receive the support pins 70 therethrough and that are circumferentially spaced 120° apart from each other in the gap between the zones 711 and 712.

In each of the six zones 711 to 716, the resistance heating wires 76, independent of each other, are installed to circulate around each of the zones to form separate heaters, so that each zone is separately heated by its own built-in heater. The semiconductor wafer W held by the holder 7 is heated by the heaters built in the six zones 711 to 716. The zones 711 to 716 each have a sensor 710 that measures the temperature in each zone, using a thermocouple. Passing through the inside of the generally-cylindrical shaft 41, the sensors 710 are connected to the controller 3.

To heat the hot plate 71, the controller 3 controls the amounts of power to be supplied to the resistance heating wires 76 installed in the six zones 711 to 716, so that the temperature in each zone, measured by the sensor 710, becomes a given preset temperature. The controller 3 performs temperature control for each zone with PID (proportional-integral-derivative) control. In the hot plate 71, the temperatures in the zones 711 to 716 are measured continuously until completion of the heat treatment of the semiconductor wafer W (or the heat treatment of all semiconductor wafers W, if there a plurality of semiconductor wafers W to be processed continuously), and the amount of power supplied to the resistance heating wires 76 installed in each zone, i.e., the temperature of the heater built in each zone, is individually controlled to keep the temperature in each zone at a set temperature. The set temperature for each zone may be changed by an offset value that is determined individually by a reference temperature.

The resistance heating wires 76 installed in the six zones 711 to 716 are connected to a power supply source (not shown) through power lines passing through the inside of the shaft 41. On the way from the power supply source to each zone, the power lines from the power supply source are installed inside a stainless tube, which is filled with an insulator such as magnesia (magnesium oxide), so as to be electrically insulated from each other. The inside of the shaft 41 is open to the atmosphere.

Next, the lamp house 5 includes, inside a case 51, a light source including a plurality of (in this preferred embodiment, 30) xenon flash lamps FL, and a reflector 52 provided to cover over the light source. The case 51 of the lamp house 5 has a lamp-light irradiation window 53 mounted to its bottom. The lamp-light irradiation window 53, which forms the floor of the lamp house 5, is a plate-like member made of quartz. The lamp house 5 is placed above the chamber 6 so that the lamp-light irradiation window 53 faces the chamber window 61. The lamp house 5 irradiates the semiconductor wafer W, held by the holder 7 in the chamber 6, with light emitted from the flash lamps FL through the lamp-light irradiation window 53 and the chamber window 61, to thereby heat the semiconductor wafer W.

The plurality of flash lamps FL are rod-like lamps each in the shape of an elongated cylinder and are arrayed in a plane so that they are longitudinally parallel to each other in a plane along the major surface of a semiconductor wafer W held by the holder 7 (i.e., in the horizontal direction). The plane defined by the array of the flash lamps FL is thus also a horizontal plane.

Figure 6:
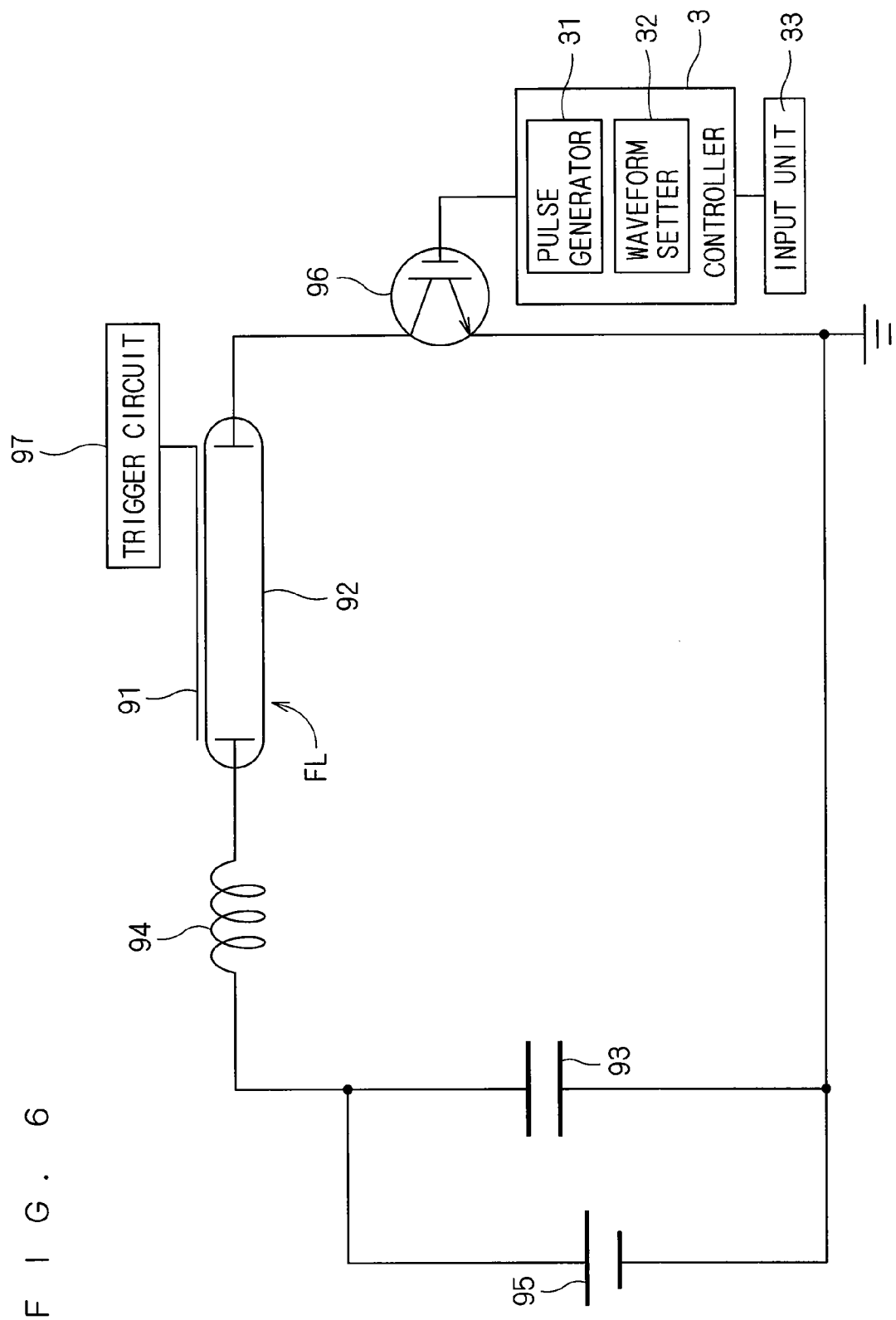
FIG. 6 shows a driving circuit for one flash lamp.

FIG. 6 shows a driving circuit for one flash lamp FL. As shown, a capacitor 93, a coil 94, the flash lamp FL, and a switching element 96 are connected in series. The flash lamp FL includes a rod-like glass tube (discharge tube) 92 that contains xenon gas sealed therein and that has positive and negative electrodes at opposite ends; and a trigger electrode 91 additionally provided on the outer peripheral surface of the glass tube 92. The capacitor 93 receives a given voltage applied from a power supply unit 95 and accumulates a charge responsive to the applied voltage. The trigger electrode 91 will receive a voltage applied from a trigger circuit 97. The timing of voltage application from the trigger circuit 97 to the trigger electrode 91 is under the control of the controller 3.

The present preferred embodiment employs an insulated-gate bipolar transistor (IGBT) as the switching element 96. The IGBT is a bipolar transistor that incorporates a MOSFET (metal-oxide-semiconductor field-effect transistor) into the gate part, and it is a switching element suitable for handling a large amount of power. The switching element 96 receives at its gate, a pulse signal from a pulse generator 31 in the controller 3.

With the capacitor 93 in the charged state, even if a pulse is output to the gate of the switching element 96 and high voltage is accordingly applied to the electrodes across the glass tube 92, no current will flow in the glass tube 92 under normal conditions because a xenon gas is electrically insulative. However if the insulation is broken by application of voltage from the trigger circuit 97 to the trigger electrode 91, a current will momentarily flow between the electrodes across the glass tube 92, and resultant excitation of atoms or molecules of xenon will cause light emission.

The reflector 52 in FIG. 1 is provided above the plurality of flash lamps FL so as to cover all of them. The fundamental function of the reflector 52 is to reflect light emitted from the plurality of flash lamps FL toward the holder 7. The reflector 52 is formed of an aluminum-alloy plate and has one surface (the surface on the side facing the flash lamps FL) roughened by abrasive blasting to have a satin finish. The reason for such surface roughing is that the reflector 52 with a perfect mirror surface may produce a regular pattern of intensity of the reflected light from the plurality of flash lamps FL, thereby causing deterioration in the uniformity of surface temperature distribution across the semiconductor wafer W.

The controller 3 controls the above-mentioned various operating mechanisms installed in the heat treatment apparatus 1. The controller 3 is similar in hardware construction to general computers. Specifically, the controller 3 includes a CPU performing various computations; a ROM that is a read-only memory storing a basic program, a RAM that is a readable/writable memory storing various pieces of information; and a magnetic disk that stores control software, data, and the like. The controller 3 also includes the pulse generator 31 and a waveform setter 32 and is connected to an input unit 33. The input unit 33 may be any of various known input equipment such as a keyboard, a mouse, or a touch panel. The waveform setter 32 sets a pulse-signal waveform, based on the contents of input from the input unit 33, and the pulse generator 31 generates a pulse signal with that waveform.

Other than the components described above, the heat treatment apparatus 1 also includes various cooling structures, in order to prevent an excessive temperature rise in the chamber 6 and in the lamp house 5 due to heat energy generated from the flash lamps FL and the hot plate 71 during the heat treatment of the semiconductor wafer W. For example, a water cooling tube (not shown) is provided in the chamber side portion 63 and the chamber bottom portion 62 of the chamber 6. The lamp house 5 is provided with a gas supply pipe 55 and an exhaust gas pipe 56 for formation of an internal gas flow and heat exhaustion, thereby providing an air-cooling system (cf. FIGS. 1 and 5). Air is also supplied into the space between the chamber window 61 and the lamp-light irradiation window 53, in order to cool the lamp house 5 and the chamber window 61.

Next, the procedure for processing the semiconductor wafer W in the heat treatment apparatus 1 is described. First, the holder 7 is moved down from the processing position in FIG. 5 to the transfer position in FIG. 1. The "processing position" is the position of the holder 7 in the chamber 6, shown in FIG. 5, where the semiconductor wafer W is irradiated with light emitted from the flash lamps FL. The "transfer position" is the position of the holder 7 in the chamber 6, shown in FIG. 1, where the semiconductor wafer W is transported into and out of the chamber 6. A reference position of the holder 7 in the heat treatment apparatus 1 is the processing position; that is, the holder 7 is in the processing position prior to processing, and upon start of processing, it moves down to the transfer position. As shown in FIG. 1, when moved down to the transfer position, the holder 7 is in close proximity to the chamber bottom portion 62, so that the upper ends of the support pins 70 protrude through the holder 7 upwardly above the holder 7.

Then, when the holder 7 is moved down to the transfer position, the valves 82 and 87 are opened to introduce a nitrogen gas at room temperature into the heat treatment space 65 of the chamber 6. The gate valve 185 is then opened to open the transport opening 66, and the semiconductor wafer W is transported through the transport opening 66 into the chamber 6 and placed on the plurality of support pins 70, using a transport robot outside the apparatus.

The nitrogen gas supplied into the chamber 6 at the time of transport of the semiconductor wafer W is purged at rates of about 40 L/min. The nitrogen gas supplied flows from the gas introduction buffer 83 in the direction indicated by the arrows AR4 in FIG. 2 within the chamber 6 and is exhausted through the exhaust path 86 and the valve 87 in FIG. 1 using a utility exhaust system. Part of the nitrogen gas supplied to the chamber 6 is exhausted also from an exhaust port (not shown) provided inside the bellows 47. In each step described below, the nitrogen gas shall constantly be supplied to and exhausted from the chamber 6, and the amount of supply of the nitrogen gas shall widely vary depending on the steps in the process of processing the semiconductor wafer W.

After the transport of the semiconductor wafer W into the chamber 6, the transport opening 66 is closed with the gate valve 185. The holder elevating mechanism 4 then moves the holder 7 from the transfer position up to the processing position close to the chamber window 61. In the course of moving the holder 7 upward from the transfer position, the semiconductor wafer W is transferred from the support pins 70 to the susceptor 72 of the holder 7 and then placed and held on the upper surface of the susceptor 72. When the holder 7 has moved up to the processing position, the semiconductor wafer W held on the susceptor 72 has also been placed at the processing position.

Each of the six zones 711 to 716 of the hot plate 71 has been heated up to a given temperature by its own individual built-in heater (the resistance heating wires 76) provided inside (in the space between the upper plate 73 and the lower plate 74). With the holder 7 moved up to the processing position and brought in contact with the semiconductor wafer W, the semiconductor wafer W is preheated by the built-in heaters of the hot plate 71 and its temperature accordingly rises gradually.

About 60-sec preheating at this processing position causes the temperature of the semiconductor wafer W to rise up to a preset preheating temperature T1. The preheating temperature T1 shall be on the order of 200 to 800° C., preferably on the order of 350 to 550° C., at which temperatures there is no apprehension that impurities implanted in the semiconductor wafer W will be diffused by heat. A distance between the holder 7 and the chamber window 61 shall be adjustable to any value by controlling the amount of rotation of the motor 40 in the holder elevating mechanism 4.

After a lapse of about 60 seconds of preheating time, the flash lamps FL start to emit light to heat (anneal) the semiconductor wafer W. For light emission from the flash lamps FL, a charge has previously been stored in the capacitor 93, using the power supply unit 95. With the capacitor 93 in the charged state, a pulse signal is output from the pulse generator 31 in the controller 3 to the switching element 96.

Figure 7:
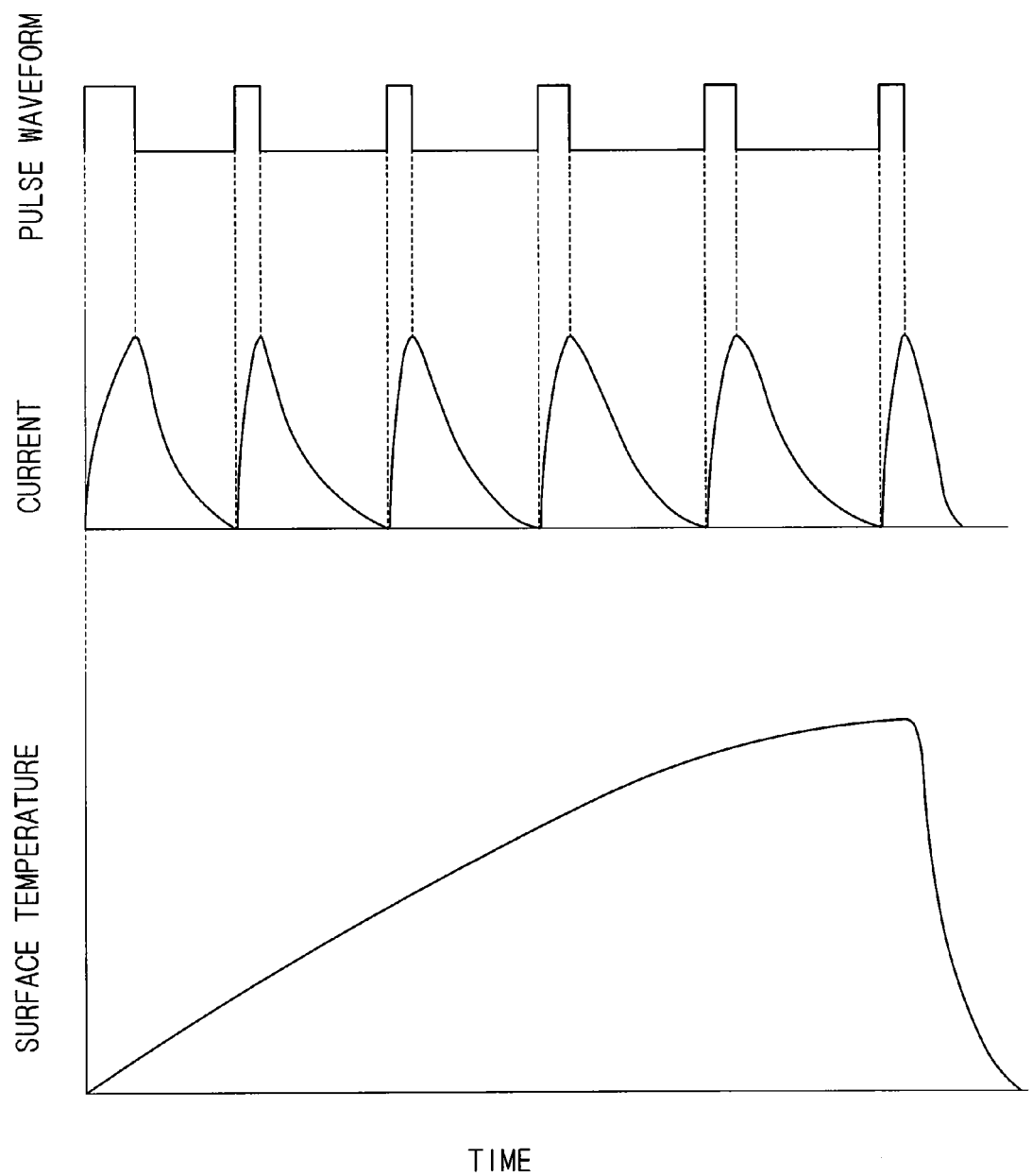
FIG. 7 illustrates by way of example the correlation of the pulse-signal waveform with the current flowing through the circuit and the surface temperature of a semiconductor wafer.

FIG. 7 shows, by way of example, the correlation of the pulse-signal waveform with the current flowing through the circuit and the surface temperature of the semiconductor wafer W. In the present example, a pulse signal with the waveform as illustrated in the upper row of FIG. 7 is output from the pulse generator 31. The waveform of the pulse signal is defined by input of parameters as shown in Table 1 below, from the input unit 33.

TABLE 1

| n | Pn | Sn |
|---|-----|------|
| 0 | 800 | 1600 |
| 1 | 400 | 2000 |
| 2 | 400 | 2000 |
| 3 | 500 | 2200 |
| 4 | 500 | 2200 |
| 5 | 400 | 0 |

In Table 1, $P_n$ is the pulse width and $S_n$ is the space width, both in microseconds. The pulse width is the duration of time each pulse is at a high level; and the space width is the interval of time between pulses. When an operator inputs the parameters, namely the pulse width, the space width, and the number of pulses shown in Table 1, from the input unit 33 to the controller 3, the waveform setter 32 in the controller 3 sets a pulse waveform including six pulses of different pulse widths as illustrated in the upper row of FIG. 7. Then, the pulse generator 31 outputs a pulse signal with the pulse waveform set in the waveform setter 32. The result is that the pulse signal with the waveform as illustrated in the upper row of FIG. 7 is applied to the gate of the switching element 96 to thereby control drive of the switching element 96.

In synchronization with the timing of turn-on of the pulse signal output from the pulse generator 31, the controller 3 controls and causes the trigger circuit 97 to apply voltage to the trigger electrode 91. This produces a current flow between the electrodes across the glass tube 92 when the pulse signal fed to the gate of the switching element 96 is ON; and resultant excitation of atoms or molecules of xenon will cause light emission. The application of voltage to the trigger electrode 91 in synchronization with the timing of turn-on of that pulse signal, as well as the output of the pulse signal with the waveform illustrated in the upper row of FIG. 7 from the controller 3 to the gate of the switching element 96, produces a current flow as illustrated in the middle row of FIG. 7, in the circuit including the flash lamp FL. In other words, only when the pulse signal fed to the gate of the switching element 96 is ON, a current will flow through the glass tube 92 in the flash lamp FL, causing light emission. The current waveform for each individual pulse shall be defined by the constant of the coil 94.

The light emission from the flash lamp FL resulting from the current flow as illustrated in the middle row of FIG. 7 results in light irradiation and heating of the semiconductor wafer W held by the holder 7 at the processing position, so that the surface temperature of the semiconductor wafer W fluctuates as illustrated in the lower row of FIG. 7. If, as in conventional methods, the flash lamp FL emits light without the use of the switching element 96, the light is an extremely short and strong flash of light that is emitted over a time on the order of 0.1 to 10 milliseconds, so that the surface temperature of the semiconductor wafer W will reach a maximum temperature in a matter of several milliseconds. On the contrary, as in the present preferred embodiment, connecting the switching element 96 to the circuit and outputting a pulse signal as illustrated in the upper row of FIG. 7 to the gate of the switching element 96 provides, in a sense, chopper control over light emission from the flash lamp FL, so that the surface temperature of the semiconductor wafer W will take more time (approximately 10 to 15 milliseconds) to reach a maximum temperature, as compared with conventional flash-heating cases. The maximum temperature for the surface temperature of the semiconductor wafer W is a processing temperature T2 on the order of 1000° C. to 1100° C. that is roughly comparable to those in conventional flash-heating cases.

At the completion of light irradiation and heating and after about 10 seconds of standby time at the processing position, the holder elevating mechanism 4 again moves the holder 7 down to the transfer position shown in FIG. 1, where the semiconductor wafer W is transferred from the holder 7 to the support pins 70. Then, the gate valve 185 is opened to open the transport opening 66 having been closed, and the semiconductor wafer W placed on the support pins 70 is transported out of the apparatus, using the transport robot. This completes the light irradiation and annealing of the semiconductor wafer W in the heat treatment apparatus 1.

As previously described, during the heat treatment of the semiconductor wafer W in the heat treatment apparatus 1, a nitrogen gas is continuously supplied into the chamber 6, where the amount of the supply is about 30 liters per minute when the holder 7 is in the processing position and about 40 liters per minute when the holder 7 is in any position other than the processing position.

Now, in the above example, the surface temperature of the semiconductor wafer W is raised over a relatively long period of time by outputting a pulse signal as illustrated in the upper row of FIG. 7 to the gate of the switching element 96 so that a current as illustrated in the middle row of FIG. 7 passes through the flash lamp FL which then emits light. The timing of the light emission from the flash lamp FL, however, is not limited the example of FIG. 7, and it will be determined freely by changing the waveform of the pulse signal output to the gate of the switching element 96. A change in the waveform of the pulse signal is readily done using the input unit 33.

Figure 8:
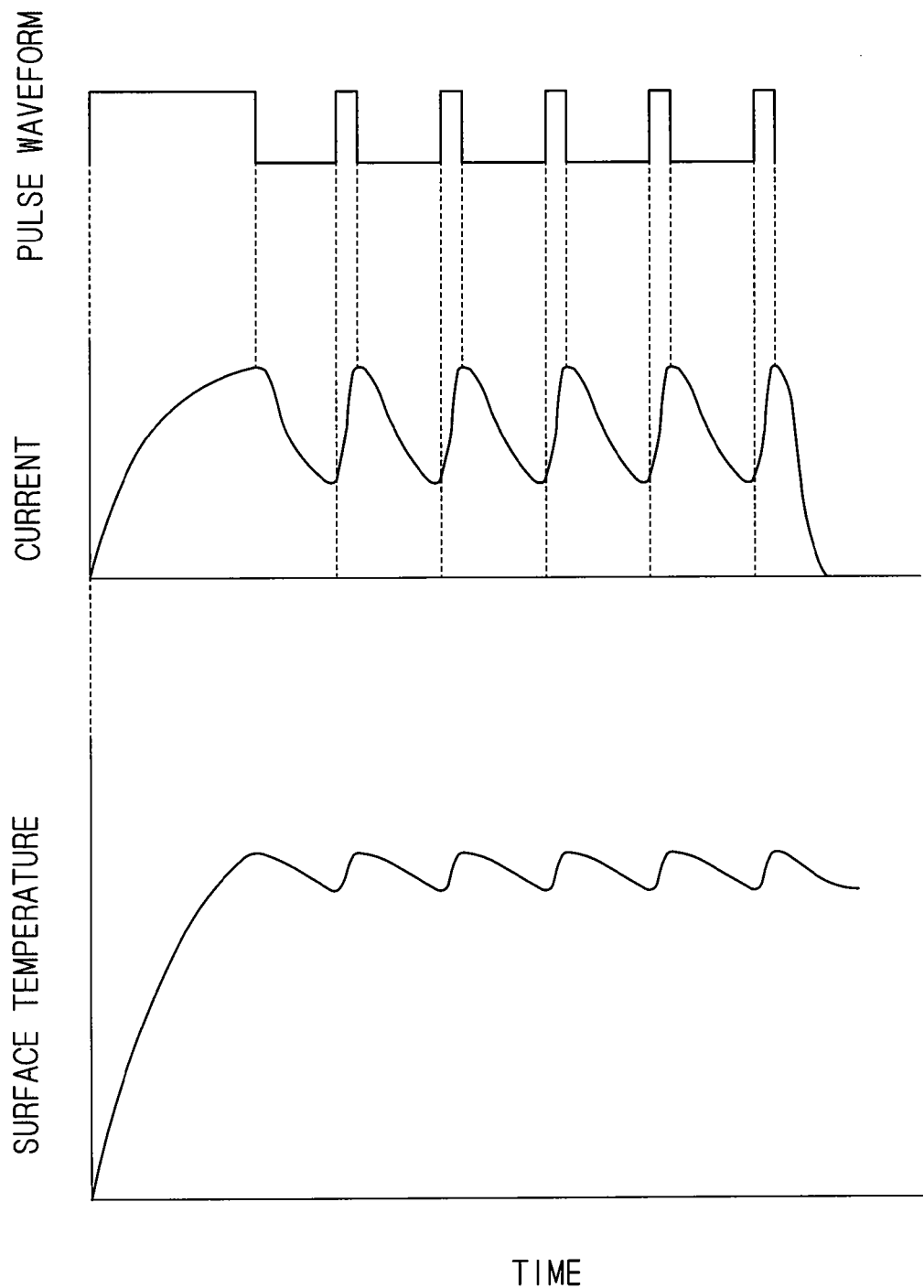
FIG. 8 illustrates by way of example the correlation of the pulse-signal waveform with the current flowing through the circuit and the surface temperature of a semiconductor wafer.

For example, upon the input of parameters as shown in Table 2 below, from the input unit 33, the waveform setter 32 in the controller 3 sets a pulse waveform as illustrated in the upper row of FIG. 8 in the same way as described above. Then, the pulse generator 31 outputs a pulse signal with the pulse waveform set in the waveform setter 32, as illustrated in the upper row of FIG. 8, to the gate of the switching element 96.

TABLE 2

| n | Pn | Sn |
|---|-----|-----|
| 0 | 800 | 400 |
| 1 | 100 | 400 |
| 2 | 100 | 400 |
| 3 | 100 | 400 |
| 4 | 100 | 400 |
| 5 | 100 | 0 |

A charge has previously been stored in the capacitor 93, and in synchronization with the timing of turn-on of the pulse signal output from the pulse generator 31, the controller 3 controls and causes the trigger circuit 97 to apply voltage to the trigger electrode 91. This produces a current flow as illustrated in the middle row of FIG. 8 through the flash lamp FL and accordingly causes light emission therefrom, resulting in light irradiation and heating of the semiconductor wafer W held by the holder 7; the surface temperature of the semiconductor wafer W fluctuates as illustrated in the lower row of FIG. 8. Referring to the temperature profile illustrated in the lower row of FIG. 8, the surface temperature of the semiconductor wafer W reaches a maximum temperature within a relatively short period of time and thereafter remains almost unchanged over a given period of time. In other words, the waveform should be set so that the initial pulse has a relatively long width and subsequent pulses of a relatively short width are repeated, as illustrated in the upper row of FIG. 8; and a pulse signal with that waveform should be output to the gate of the switching element 96. This provides such a temperature profile that the raised surface temperature of the semiconductor wafer W is held at a given temperature.

Figure 9:
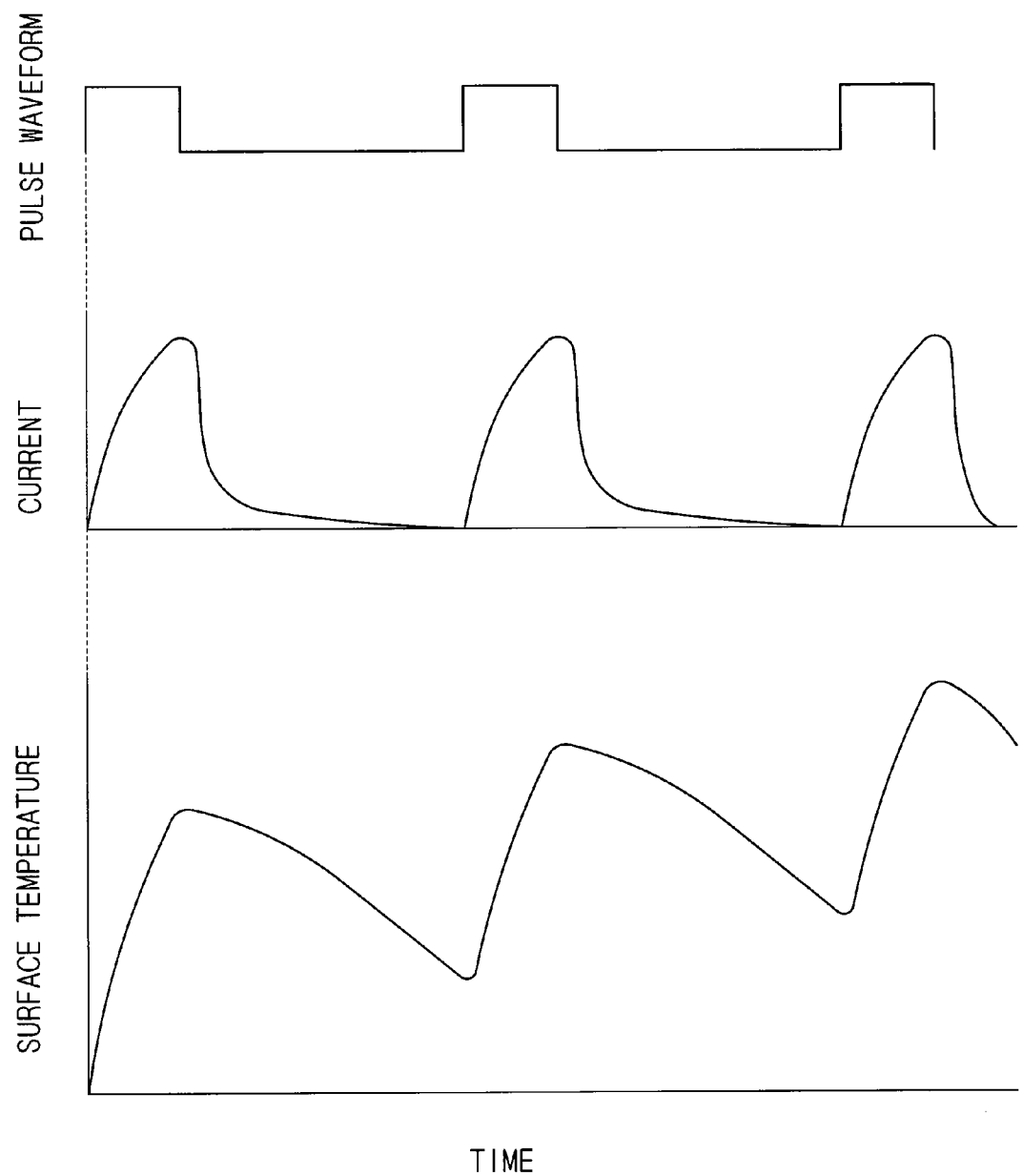
FIG. 9 illustrates by way of example the correlation of the pulse-signal waveform with the current flowing through the circuit and the surface temperature of a semiconductor wafer.

Alternatively, upon the input of parameters as shown in Table 3 from the input unit 33, the waveform setter 32 in the controller 3 sets a pulse waveform as illustrated in the upper row of FIG. 9 in the same way as described above. The pulse generator 31 then outputs a pulse signal with the pulse waveform set in the waveform setter 32, as illustrated in the upper row of FIG. 9, to the gate of the switching element 96.

TABLE 3

| n | Pn | Sn |
|---|------|------|
| 0 | 1000 | 3000 |
| 1 | 1000 | 3000 |
| 2 | 1000 | 0 |

As described above, a charge has previously been stored in the capacitor 93, and in synchronization with the timing of turn-on of the pulse signal output from the pulse generator 31, the controller 3 controls and causes the trigger circuit 97 to apply voltage to the trigger electrode 91. This produces a current flow as illustrated in the middle row of FIG. 9 through the flash lamp FL and accordingly causes light emission therefrom, resulting in light irradiation and heating of the semiconductor wafer W held by the holder 7; the surface temperature of the semiconductor wafer W fluctuates as illustrated in the lower row of FIG. 9. Referring to the temperature profile illustrated in the lower row of FIG. 9, the surface temperature of the semiconductor wafer W repeatedly rises and falls.

As described so far, according to the present preferred embodiment, the series connection of the IGBT as the switching element 96 to the driving circuit for the flash lamp FL and the output of a pulse signal to the gate of that switching element 96 provide chopper control (on-off control) over the light emission from the flash lamp FL. The waveform of the pulse signal applied to the gate of the switching element 96 can be freely set by inputting the pulse width, the space width, and the number of pulses from the input unit 33. A change in the waveform of the pulse signal output to the gate of the switching element 96 causes a change in the waveform of current flowing through the flash lamp FL and accordingly a change in the form of light emission, thereby resulting in a change in the temperature profile for the surface temperature of the semiconductor wafer W. In other words, changing the waveform of the pulse signal output to the gate of the switching element 96 allows free change in light-irradiation and annealing (light-emission) time using the flash lamp FL within the range of one millisecond to less than one second, thereby resulting in free setting of the temperature profile for the surface temperature of the semiconductor wafer W.

While the preferred embodiment of the invention has been described so far, various modifications can be made other than those described above without departing from the spirit and scope of the invention. For example, while the preferred embodiment described above has illustrated the three patterns of the waveform of the pulse signal output to the gate of the switching element 96, the waveform of the pulse signal is not limited to those three patterns illustrated in FIGS. 7 to 9, and it may be of any pattern. More specifically, the setting of the pulse-signal waveform in the waveform setter 32 is based on the input of parameters such as the pulse width, the space width, and the number of pulses, from the input unit 33. It is thus, for example, possible to output a pulse signal including only a single pulse from the pulse generator 31. That is, the pulse signal output to the gate of the switching element 96 should be of any waveform including one or more pulses.

The way of setting of the pulse-signal waveform is not limited to one-by-one input of parameters such as the pulse width from the input unit 33, and it may, for example, be direct operator input of a graphical waveform from the input unit 33; or a readout of a waveform that has been preset and stored in a storage such as a magnetic disk; or a download of a waveform from the outside of the heat treatment apparatus 1.

While the preferred embodiment described above employs an IGBT as the switching element 96, the invention is not limited thereto; the switching element 96 may be any transistor other than the IGBT as long as it is capable of turning the circuit on and off in response to the waveform of an input pulse signal. It is however to be noted that since the flash lamp FL consumes a considerably large amount of power for light emission, the switching element 96 may preferably be an IGBT or a GTO (gate turn-off) thyristor that is suitable for handling a large amount of power.

While the application of voltage to the trigger electrode 91 is in synchronization with the timing of turn-on of the pulse signal in the preferred embodiment described above, the timing of the trigger-voltage application is not limited thereto, and the voltage may be applied at fixed intervals irrespective of the waveform of the pulse signal. If the pulse signal has a narrow space width so that a given amount or more of current caused by a given pulse to flow through the flash lamp FL will remain when the next pulse starts to produce another passage of electric current, the application of a trigger voltage for each pulse is unnecessary because there is a continuous current flow through the flash lamp FL. When all the space widths of the pulse signal are narrow as illustrated in FIG. 8 of the preferred embodiment described above, the current waveform as illustrated in the middle row of FIG. 8 will be produced by applying a trigger voltage only at the time of application of the initial pulse, and thereafter without any application of a trigger voltage, only outputting the pulse signal as illustrated in the upper row of FIG. 8 to the gate of the switching element 96. In other words, the timing of trigger-voltage application is arbitrarily as long as a current flows through the flash lamp FL when the pulse signal is turned on.

While the preferred embodiment described above employs the lamp house 5 including 30 flash lamps FL, the invention is not limited thereto; the number of flash lamps FL is arbitrary. In addition, the flash lamps FL are not limited to xenon flash lamps, but they may be krypton flash lamps.

The substrates to be processed by the heat treatment apparatus according to the invention are not limited to semiconductor wafers, and they may be glass substrates for use in liquid crystal displays or the like.

While the invention has been described in detail, the foregoing description is in all aspects illustrative and not restrictive. It is understood that numerous other modifications and variations can be devised without departing from the scope of the invention.

What is claimed is:

1. A heat treatment method of irradiating a substrate with light to heat the substrate, said heat treatment method comprising the step of:

repeatedly applying a plurality of pulses to a gate of an insulated-gate bipolar transistor connected to a flash lamp, thereby, emitting light from said flash lamo to perform light irradiation to the substrate, the surface temperature of said substrate reaches a maximum temperature, and thereafter, maintaining said surface temperature at said maximum temperature for a certain period of time.

2. A heat treatment apparatus for irradiating a substrate with light to heat the substrate, said heat treatment apparatus comprising:

a holder holding a substrate;

a flash lamp emitting light to the substrate held by said holder;

an insulated-gate bipolar transistor connected in series with said flash lamp, a capacitor, and a coil; and a controller configured to repeatedly apply a plurality of pulses to a gate of said insulated-gate bipolar transistor, thereby emit light from said flash lamp and perform light irradiation to the substrate, and the surface temperature of said substrate reaches a maximum temperature, and thereafter, maintain said surface temperature at said maximum temperature for a certain period of time.

* * * * *